United States Patent
Eom et al.

(10) Patent No.: US 8,030,200 B2
(45) Date of Patent: Oct. 4, 2011

(54) METHOD FOR FABRICATING A SEMICONDUCTOR PACKAGE

(75) Inventors: Yong Sung Eom, Daejeon (KR);
Kwang-Seong Choi, Daejeon (KR);
Hyun-Cheol Bae, Daejeon (KR);
Jong-Hyun Lee, Gyeonggi-do (KR);
Jong Tae Moon, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 12/565,171

(22) Filed: Sep. 23, 2009

(65) Prior Publication Data
US 2010/0320596 A1      Dec. 23, 2010

(30) Foreign Application Priority Data

Jun. 22, 2009  (KR) .................. 10-2009-0055478

(51) Int. Cl.
*H01L 21/44* (2006.01)

(52) U.S. Cl. ........ 438/612; 438/106; 438/680; 438/780; 257/E21.006; 257/E21.007; 257/E21.077; 257/E21.17; 257/E21.267; 257/E21.499; 257/E21.502; 257/E21.508

(58) Field of Classification Search .......... 438/612, 438/613, 637, 106, 780, 680, 745, 769; 257/E21.17, 257/E21.006, E21.007, E21.977, E21.267, 257/E21.499, E21.502, E21.508

See application file for complete search history.

(56) References Cited

U.S. PATENT DOCUMENTS

| 5,136,365 | A | 8/1992 | Pennisi et al. |
| 6,064,120 | A * | 5/2000 | Cobbley et al. ............... 257/780 |
| 6,878,435 | B2 * | 4/2005 | Paik et al. ..................... 428/215 |
| 7,227,267 | B2 * | 6/2007 | Lee et al. ....................... 257/778 |
| 2010/0006625 | A1 * | 1/2010 | Eom et al. ..................... 228/164 |

FOREIGN PATENT DOCUMENTS

| EP | 1445995 A1 | 8/2004 |
| KR | 2007-0052791 A | 5/2007 |

OTHER PUBLICATIONS

Jong-Min Kim et al., "New Electrically Conductive Adhesives Filled with Low-Melting-Point Alloy Fillers" Materials Transactions, vol. 45, No. 1 (2004) pp. 157 to 160.

* cited by examiner

*Primary Examiner* — David Nhu
(74) *Attorney, Agent, or Firm* — Rabin & Berdo, PC

(57) ABSTRACT

A method for fabricating a semiconductor package, includes the steps of forming a first terminal at a first substrate; mixing a polymer resin and solder particles to provide a mixture; covering at least one of an upper surface and side surfaces of the first terminal with the mixture; and heating the first substrate at a temperature higher than a melting point of the solder particles of the mixture to form a solder layer that covers the at least one of an upper surface and a side surface of the first terminal. The solder particles flow or diffuse toward the terminal in the heated polymer resin to adhere to at least some of the exposed surfaces of the terminal thereby forming the solder layer. The solder layer improves the adhesive strength between the terminals of the semiconductor chip and the substrate in the subsequent flip chip bonding process.

14 Claims, 14 Drawing Sheets

METHOD FOR FABRICATING A SEMICONDUCTOR PACKAGE

CROSS-REFERENCE TO RELATED APPLICATIONS

This U.S. non-provisional patent application claims priority under 35 U.S.C. §119 of Korean Patent Application No. 10-2009-0055478, filed on Jun. 22, 2009, the entire contents of which are hereby incorporated by reference.

BACKGROUND OF THE INVENTIVE CONCEPT

The present invention disclosed herein relates to a method for fabricating semiconductor package and a semiconductor package fabricated using the same.

As semiconductor integrated circuit applied to electronic devices is highly densified and integrated, the multiplying of pin and the narrowing of pitch progress rapidly in the electrode terminal of semiconductor chip. In mounting on the interconnection substrate of the semiconductor chip, moreover, a flip chip bonding is widely used for decreasing interconnection delay. This flip chip bonding brings the external electrode pad of the semiconductor chip in contact with the pad of a mounting substrate, and by applying heat, allows the two pads to be bonded in a reflow process. In such a flip chip bonding process, since heat is applied and compression is performed simply, the bonding strength between the electrode pad of the semiconductor chip and the pad of the mounting substrate is very low. Accordingly, the electrode pad of the semiconductor chip and the pad of the mounting substrate are easily disconnected by a physical impact.

SUMMARY OF THE INVENTIVE CONCEPT

The present invention provides a method for fabricating semiconductor package, which is suitable for the multiplying of pin and the narrowing of pitch, and can increase bonding strength.

The present invention also provides a semiconductor package, which is suitable for the multiplying of pin and the narrowing of pitch, and has bonding strength that has been increased.

Embodiments of the present invention provide a method for fabricating semiconductor package including: forming a first terminal in a first substrate; providing a mixture including a polymer resin and a solder particle to cover at least one upper surface and side surface of the first terminal; and heating the first substrate at a temperature higher than a melting point of the solder particle to form a solder layer covering the upper surface and side surface of the first terminal.

In some embodiments, the first terminal may protrude upward from an upper surface of the first substrate, and may include a metal pad and a metal bump which is disposed on the metal pad. At this point, the metal bump may have a pillar type or a stud type.

In other embodiments, the method may further include forming a hole in the first substrate, before forming the first terminal, wherein the first terminal may cover a side wall and bottom of the hole, and the solder layer may fill the hole. The method may further include planarizing a front surface and rear surface of the first substrate.

In still other embodiments, the mixture may be extended to cover the first terminal and another first terminal adjacent to the first terminal.

In even other embodiments, the method may further include removing the polymer resin to expose the solder layer, after forming the solder layer. The method may further include: providing a flowable hardening resin covering a side surface of the exposed solder layer; disposing a second substrate, in which a second terminal is formed, on the first substrate to come in contact with the second terminal and the solder layer; and heating the first substrate at a temperature higher than a melting point of the solder layer to couple the first and second terminals through the solder layer, and hardening the flowable hardening resin.

In yet other embodiments, the method may further include disposing a second substrate, in which a second terminal is formed, on the first substrate before heating the first substrate to bring the second terminal in contact with the first terminal. In this case, the mixture may further include a hardening agent, and the polymer resin may be hardened with the hardening agent by heating the first substrate.

In further embodiments, the second substrate may include a semiconductor chip.

In other embodiments of the present invention, a semiconductor package includes: a first substrate; a first terminal on the first substrate; and a solder layer covering a surface of the first terminal which is exposed, without contacting the first substrate.

In some embodiments, the semiconductor package may further include: a second substrate disposed on the first substrate; and a second terminal, adjacent to the first terminal, formed in a lower surface of the second substrate, wherein the solder layer may be extended to cover a side surface of the second terminal.

In other embodiments, the semiconductor package may further include: a dielectric layer filling a space between the first and second substrates; and a solder particle disposed in the dielectric layer, and separated from the solder layer.

BRIEF DESCRIPTION OF THE DRAWINGS

The accompanying figures are included to provide a further understanding of the present invention, and are incorporated in and constitute a part of this specification. The drawings illustrate exemplary embodiments of the present invention and, together with the description, serve to explain principles of the present invention. In the figures.

DETAILED DESCRIPTION OF THE EMBODIMENTS

Figure 1A:
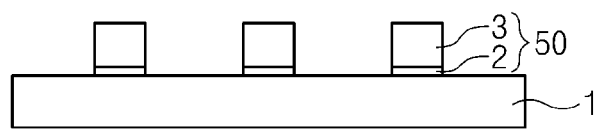
FIGS. 1A through 1F are cross-sectional views illustrating a process of fabricating a semiconductor package according to an embodiment of the inventive concept.

Preferred embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. In the figures, the dimensions of layers and regions are exaggerated for clarity of illustration. It will also be understood that when a layer (or film) is referred to as being 'on' another layer or substrate, it can be directly on the other layer or substrate, or intervening layers may also be present. Further, it will be understood that when a layer is referred to as being 'under' another layer, it can be directly under, and one or more intervening layers may also be present. In addition, it will also be understood that when a layer is referred to as being 'between' two layers, it can be the only layer between the two layers, or one or more intervening layers may also be present. Like reference numerals refer to like elements throughout.

Embodiment 1

FIGS. 1A through 1F are across-sectional views illustrating a process of fabricating a semiconductor package according to an embodiment of the inventive concept.

Referring to FIG. 1A, a first substrate 1 in which a first pad 2 is formed is prepared. The first substrate 1, for example, may be a mounting substrate on which a semiconductor chip is mounted. Alternatively, the first substrate 1 may be a silicon substrate, a printed circuit board or a ceramic substrate. The first pad 2 may be formed of titanium, nickel, platinum or metal such as aurum, and may be formed in a process such as electric plating. A pillar type bump 3 is formed on the first pad 2. The pillar type bump 3, for example, may be formed of copper, and may be formed in a process such as electric plating. The first pad 2 and the bump 3 may configure a first terminal 50.

Figure 1B:
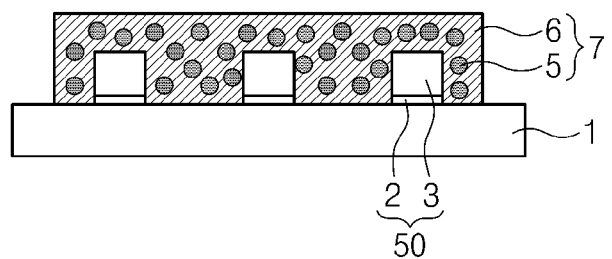

Referring to FIG. 1B, a mixture 7 including a solder particle 5 and a polymer resin 6 is doped on the first substrate 1 in which the pillar type bump 3 is formed. The mixture 7 covers the both side surfaces and upper surface of the first terminal 50 and fills a space between the first terminal 50 and another first terminal 50 adjacent to it. In the mixture 7, the solder particle 5 and the polymer resin 6 may be mixed at a volume rate of 1:9 to 5:5. The solder particle 5, for example, may have a diameter of about 0.1 to 100 μm. The solder particle 5 may be plumbum, stannum, indium, bismuth, antimony, argentum or metal particle such as alloy of these. The polymer resin 6 may flow. The polymer resin 6 may remove an oxide layer from the surface of the solder particle 5 when being heated. The polymer resin 6, for example, may be an epoxy-based resin, and may include bisphenol A and epichlorohydrin. The mixture 7 may further include a reductant. The mixture 7 may further include a deforming agent.

Figure 1C:
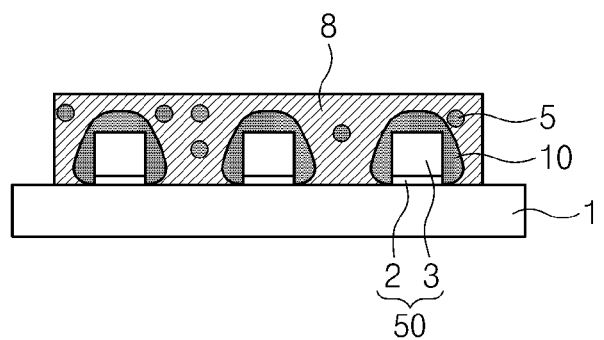

Referring to FIG. 1C, the mixture 7 is doped, and the first substrate 1 is heated. At this point, the first substrate 1 may be heated at a temperature higher than the melting point of the solder particle 5. Therefore, the heated polymer resin 6 removes an oxide layer from the surface of the solder particle 5, and the solder particle 5 flows inside the polymer resin 6 to move to the surface of the first pad 2 and the bump 3, thereby being adhered to the surface. Consequently, a solder layer 10 covering the surface of the first terminal 50 including the bump 3 and the first pad 2. That is, the solder layer 10 is formed to cover the upper surface and both side surfaces of the pillar type bump 3 and the both side surfaces of the first pad 2. When the mixture 7 further includes a deforming agent, the deforming agent suppresses the production of a gas in the mixture 7, and thus the solder particle 5 allows wet characteristic to be better expressed in the surface of the bump 3 and the surface of the first pad 2. The polymer resin 6 may be changed into a state before gelation, for example, a resin layer 8 of an almost liquid state by the heating process. The solder particle 5, which is far away from the bump 3 and the first pad 2, cannot reach the surface of the bump 3 and the surface of the first pad 2, and is left inside the resin layer 8.

Figure 1D:
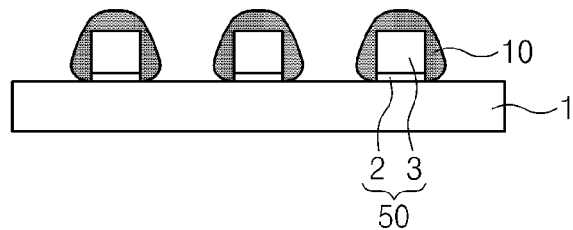

Referring to FIG. 1D, the solder layer 10 is formed, and the resin layer 8 is removed with a solvent agent. For example, the solvent agent may be acetone, benzene, toluene or water. When removing the resin layer 8, the solder particle 5 existing inside the resin layer 8 may be removed together. Accordingly, the solder layer 10 and the upper surface of the first substrate 1 peripheral to it are exposed.

A semiconductor chip or another substrate may be mounted on the first substrate 1 in FIG. 1D. This case will be described below with reference to FIGS. 1E and 1F.

Figure 1E:
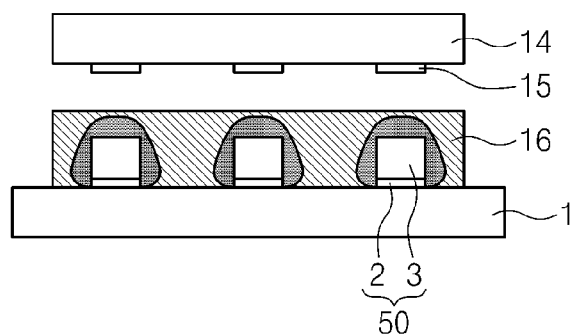

Referring to FIG. 1E, a flowable hardening resin 16 is doped to cover the surface of the exposed solder layer 10 and the upper surface of the first substrate 1. The flowable hardening resin 16 may fill a space between solder layers 10 covering the surfaces of the adjacent first terminals 50. The flowable hardening resin 16 may be a material similar to the polymer resin 6, and may further include a hardening agent. The flowable hardening resin 16 may also have a function of removing an oxide layer. The solder particle 5 does not exit inside flowable hardening resin 16. The flowable hardening resin is doped, and a second substrate 14 in which a second pad 15 is formed is disposed on the first substrate 1. The second substrate 14 may be another mounting substrate, or may be a semiconductor chip. The second pad 15 may be called a second terminal.

Figure 1F:
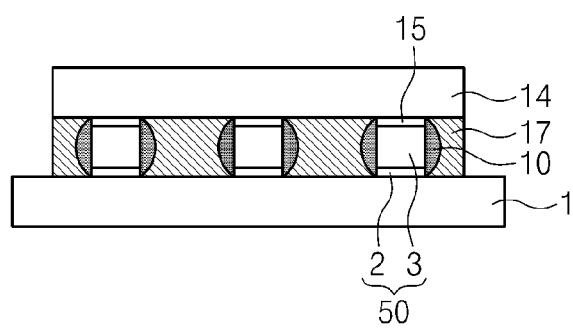

Referring to FIG. 1F, the second substrate 14 is disposed to come in contact with the second pad 15 and the upper surface of the solder layer 10, and the first substrate 1 is heated at a temperature higher than the melting point of the solder layer 10. Thus, the flowable hardening resin 16 removes an oxide layer that may be formed in the surface of the solder layer 10, and the solder layer 10 flows (or diffuses) to the both side surfaces of the second pad 15, thereby being adhered. The solder layer 10, therefore, may cover the first pad 2, the pillar type bump 3 and the both side surfaces of the second pad 15. Moreover, the solder layer 10 may be interposed between the pillar type bump 3 and the second pad 15. The solder layer 10, accordingly, bonds the pillar type bump 3 and the second pad 15, increasing the bonding strength between the two substrates 1 and 14. Moreover, the flowable hardening resin 16 reacts with a hardening agent included in it to be hardened through a heating process, being changed into a hardened underfill resin 17. Accordingly, as illustrated in FIGS. 1E and 1F, a flip chip bonding process and an underfill process for the semiconductor chip may be performed at the same time.

Referring to a semiconductor package in FIG. 1F, the electrical connection and physical coupling between the first substrate 1 and the second substrate 14 are achieved by the first pad 2, the pillar type bump 3, the second pad 15 and the solder layer 10 covering their surfaces. The pillar type bump 3 maintains and supports the pitch between the first substrate 1 and the second substrate 14. Moreover, the underfill resin 17 fills a space between the first substrate 1 and the second substrate 14, protecting the semiconductor package against various external environment factors such as moisture and physical impacts.

The first substrate 1 in FIG. 1D may be mounted on a mother board such as a printed circuit board in an overturned state. At this point, the first pad 2, the pillar type bump 3 and the solder layer 10 covering their surfaces configure an external terminal such as a solder bump, and may electrically connect with the mother board. In this case, in the first substrate 1, the semiconductor chip may be mounted in the surface opposite to a surface in which the solder layer 10 is disposed.

Embodiment 2

FIGS. 2A through 2F are cross-sectional views illustrating a process of fabricating a semiconductor package according to another embodiment of the inventive concept.

Figure 2A:
FIGS. 2A through 2F are cross-sectional views illustrating a process of fabricating a semiconductor package according to another embodiment of the inventive concept.
Figure 2B:
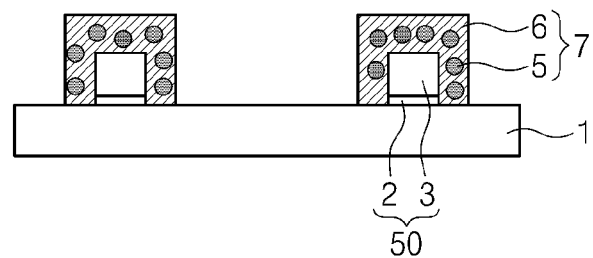
Figure 2C:
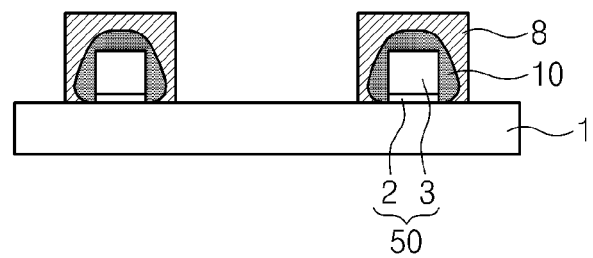
Figure 2D:
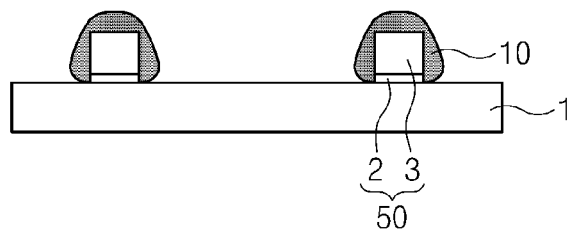
Figure 2E:
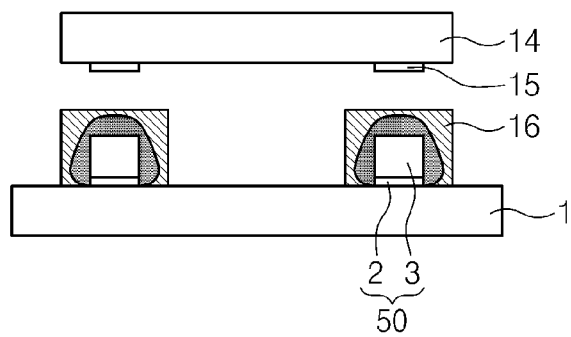
Figure 2F:
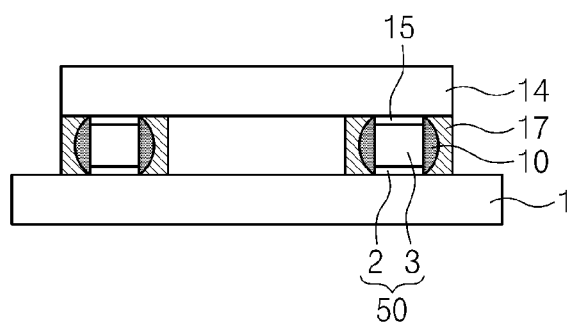

Referring to FIGS. 2A through 2F, in another embodiment of the inventive concept, the pitch between first terminals 50 is broader than the case of embodiment 1. In this way, when the pitch between the first terminals 50 is broad, a mixture 7 including a solder particle 5 and a polymer resin 6 may be selectively doped on a desired position in a screen printer process, as illustrated in FIG. 2B. Subsequently, when a heating process is performed, the oxide layer of the solder particle 5 in the mixture 7 is removed, and the solder particle 5 diffuses to the surface of the first terminal 50 to reveal wet characteristic, thereby forming a solder layer 10 covering the upper surface and both side surfaces of the first terminal 50. As shown in FIG. 2C, since distance from the edge of a region (on which the mixture 7 is doped) to the surface of the first terminal 50 is shorter than the case of embodiment 1, the solder particle 5 may not almost be left inside a resin layer 8. In FIG. 2E, the providing of a flowable hardening resin 16 may be performed in a screen printer process. In addition, detailed processes and process conditions may be the same as those of embodiment 1.

Embodiment 3

FIGS. 3A through 3F are cross-sectional views illustrating a process of fabricating a semiconductor package according to another embodiment of the inventive concept.

Figure 3A:
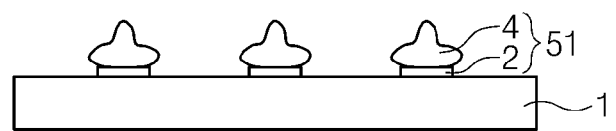
FIGS. 3A through 3F are cross-sectional views illustrating a process of fabricating a semiconductor package according to another embodiment of the inventive concept.

Referring to FIG. 3A, a first substrate 1 in which a first pad 2 is formed is prepared. A stud type bump 4 is formed on the first pad 2. The stud type bump 4 may be separately fabricated in a stud type and be raised on the first pad 2. By performing a thermal reflow process, the stud type bump 4 may be bonded on the first pad 2. For example, the stud type bump 4 may be formed of aurum, copper or an alloy of these. The first pad 2 and the stud type bump 4 may configure a first terminal 51.

Figure 3B:
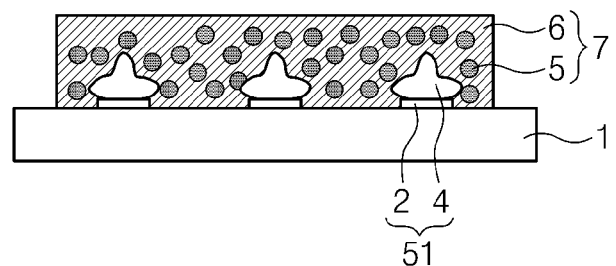

Referring to FIG. 3B, a mixture 7 including a solder particle 5 and a polymer resin 6 is doped on the first substrate 1 in which the stud type bump 4 is formed. The mixture 7 covers all the exposed surfaces of the first terminal 50 and fills a space between the first terminal 50 and another first terminal 50 adjacent to it. In the mixture 7, the solder particle 5 and the polymer resin 6 may be mixed at a volume rate of 1:9 to 5:5. The solder particle 5, for example, may have a diameter of about 0.1 to 100 μm. The solder particle 5 may be plumbum, stannum, indium, bismuth, antimony, argentum or metal particle such as alloy of these. The polymer resin 6 may flow. The polymer resin 6 may remove an oxide layer from the surface of the solder particle 5 when being heated. The polymer resin 6, for example, may be an epoxy-based resin, and may include bisphenol A and epichlorohydrin. The mixture 7 may further include a reductant. The mixture 7 may further include a deforming agent.

Figure 3C:
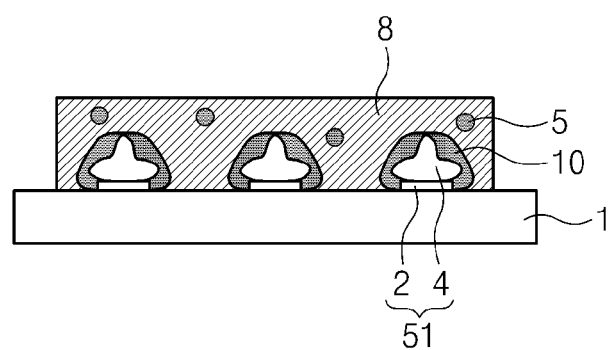

Referring to FIG. 3C, the mixture 7 is doped, and the first substrate 1 is heated. At this point, the first substrate 1 may be heated at a temperature higher than the melting point of the solder particle 5. Therefore, the heated polymer resin 6 removes an oxide layer from the surface of the solder particle 5, and the solder particle 5 flows inside the polymer resin 6 to move to the surface of the first terminal 51, thereby being adhered to the surface. Consequently, a solder layer 10 covering the surface of the first terminal 50 including the bump 4 and the first pad 2. That is, the solder layer 10 is formed to cover the bent surface of the stud type bump 4 and the both side surfaces of the first pad 2. When the mixture 7 further includes a deforming agent, the deforming agent suppresses the production of a gas in the mixture 7, and thus the solder particle 5 allows wet characteristic to be better expressed in the surface of the bump 4 and the surface of the first pad 2. The polymer resin 6 may be changed into a state before gelation, for example, a resin layer 8 of an almost liquid state by the heating process. The solder particle 5, which is far away from the bump 4 and the first pad 2, cannot reach the surface of the bump 3 and the surface of the first pad 2, and is left inside the resin layer 8.

Figure 3D:
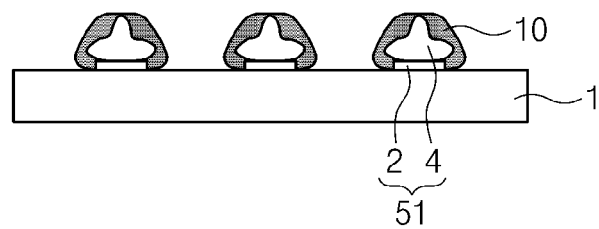

Referring to FIG. 3D, the solder layer 10 is formed, and the resin layer 8 is removed with a solvent agent. For example, the solvent agent may be acetone, benzene, toluene or water. When removing the resin layer 8, the solder particle 5 existing inside the resin layer 8 may be removed together. Accordingly, the solder layer 10 and the upper surface of the first substrate 1 peripheral to it are exposed.

Figure 3E:
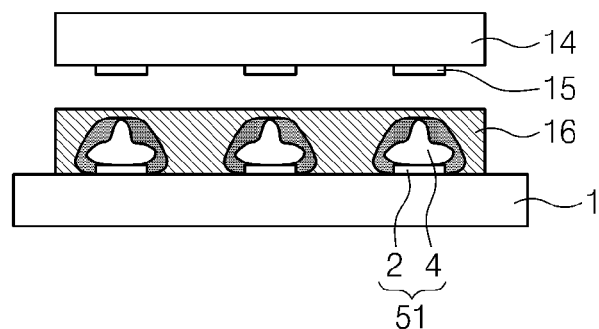

Referring to FIG. 3E, a flowable hardening resin 16 is doped to cover the surface of the exposed solder layer 10 and the upper surface of the first substrate 1. The flowable hardening resin 16 may fill a space between solder layers 10 covering the surfaces of the adjacent first terminals 50. The flowable hardening resin 16 may be a material similar to the polymer resin 6, and may further include a hardening agent. The flowable hardening resin 16 may also have a function of removing an oxide layer. The solder particle 5 does not exit inside flowable hardening resin 16. The flowable hardening resin is doped, and a second substrate 14 in which a second pad 15 is formed is disposed on the first substrate 1. The second substrate 14 may be another mounting substrate, or may be a semiconductor chip. The second pad 15 may be called a second terminal.

Figure 3F:
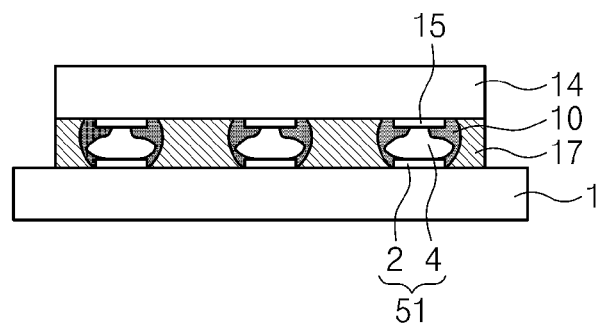

Referring to FIG. 3F, the second substrate 14 is disposed to come in contact with the second pad 15 and the upper surface of the solder layer 10, and the first substrate 1 is heated at a temperature higher than the melting point of the solder layer 10. Thus, the flowable hardening resin 16 removes an oxide layer that may be formed in the surface of the solder layer 10, and the solder layer 10 flows (or diffuses) to the both side surfaces of the second pad 15, thereby being adhered. The solder layer 10, therefore, may cover the first pad 2, the stud type bump 4 and the both side surfaces of the second pad 15. The solder layer 10, accordingly, bonds the stud type bump 4 and the second pad 15, increasing the bonding strength between the two substrates 1 and 14. Moreover, the flowable hardening resin 16 reacts with a hardening agent included in it to be hardened through a heating process, being changed into a hardened underfill resin 17. Accordingly, as illustrated in FIGS. 3E and 3F, a flip chip bonding process and an underfill process for the semiconductor chip may be performed at the same time.

Referring to a semiconductor package in FIG. 3F, the electrical connection and physical coupling between the first substrate 1 and the second substrate 14 are achieved by the first pad 2, the stud type bump 4, the second pad 15 and the solder layer 10 covering their surfaces. The stud type bump 4 maintains and supports the pitch between the first substrate 1 and the second substrate 14. Moreover, the underfill resin 17 fills a space between the first substrate 1 and the second substrate 14, protecting the semiconductor package against various external environment factors such as moisture and physical impacts.

The first substrate 1 in FIG. 3D may be mounted on a mother board such as a printed circuit board in an overturned state. At this point, the first pad 2, the stud type bump 4 and the solder layer 10 covering their surfaces configure an external terminal such as a solder bump, and may electrically connect with the mother board. In this case, in the first substrate 1, the semiconductor chip may be mounted in the surface opposite to a surface in which the solder layer 10 is disposed.

Embodiment 4

FIGS. 4A through 4E are cross-sectional views illustrating a process of fabricating a semiconductor package according to another embodiment of the inventive concept.

Figure 4A:
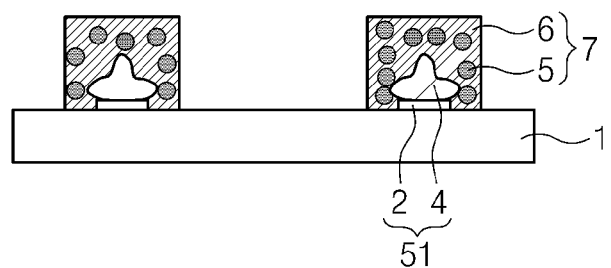
FIGS. 4A through 4E are cross-sectional views illustrating a process of fabricating a semiconductor package according to another embodiment of the inventive concept.
Figure 4B:
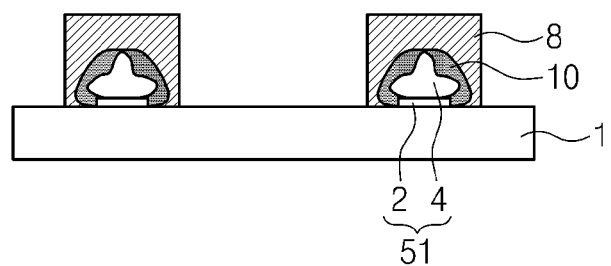
Figure 4C:
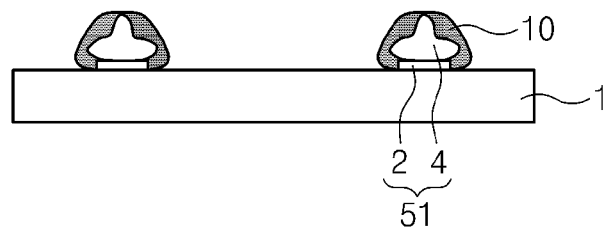
Figure 4D:
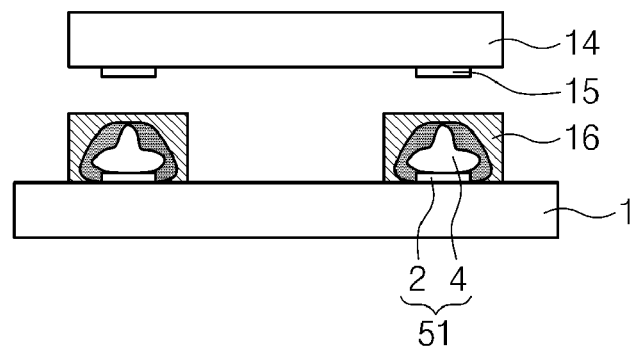
Figure 4E:
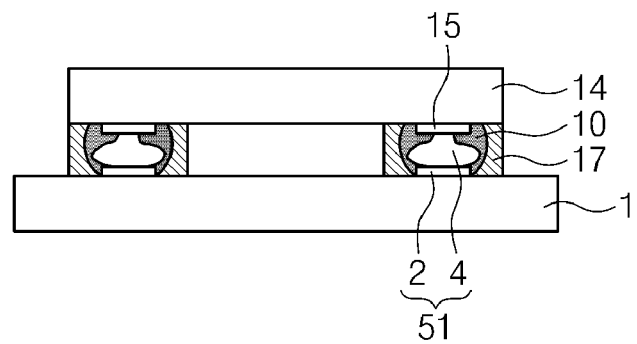

Referring to FIGS. 4A through 4E, in another embodiment of the inventive concept, the pitch between first terminals 51 is broader than the case of embodiment 1. In this way, when the pitch between the first terminals 51 is broad, a mixture 7 including a solder particle 5 and a polymer resin 6 may be selectively doped on a desired position in a screen printer process, as illustrated in FIG. 4B. Subsequently, when a heating process is performed, the oxide layer of the solder particle 5 in the mixture 7 is removed, and the solder particle 5 diffuses to the surface of the first terminal 51 to reveal wet characteristic, thereby forming a solder layer 10 covering the bent surface of the first terminal 51. As shown in FIG. 4C, since distance from the edge of a region (on which the mixture 7 is doped) to the surface of the first terminal 51 is shorter than the case of embodiment 3, the solder particle 5 may not almost be left inside a resin layer 8. In FIG. 4E, the providing of a flowable hardening resin 16 may be performed in a screen printer process. In addition, detailed processes and process conditions may be the same as those of embodiment 3.

Embodiment 5

Figure 5A:
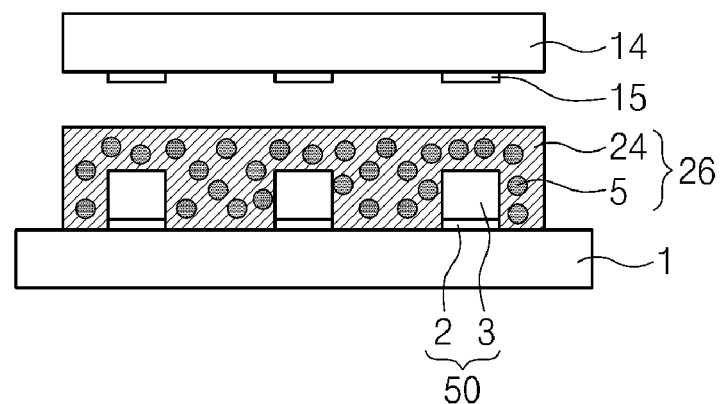
FIGS. 5A and 5B are cross-sectional views illustrating a process of fabricating a semiconductor package according to another embodiment of the inventive concept.
Figure 5B:
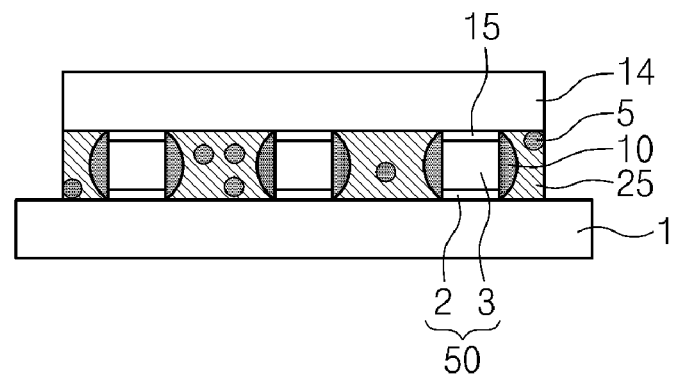

FIGS. 5A and 5B are cross-sectional views illustrating a process of fabricating a semiconductor package according to another embodiment of the inventive concept.

Referring to FIG. 5A, a first substrate 1 in which a first pad 2 is formed is prepared. A pillar type bump 3 is formed on the first pad 2. The first pad 2 and the pillar type bump 3 may configure a first terminal 50. A mixture 26 including a solder particle 5 and a flowable hardening resin 24 is doped on the first substrate 1 in which the pillar type bump 3 is formed. The mixture 26 covers all the both side surfaces and upper surface of the first terminal 50 and fills a space between the first terminal 50 and another first terminal 50 adjacent to it. In the mixture 26, the solder particle 5 and the flowable hardening resin 24 may be mixed at a volume rate of 1:9 to 5:5. The solder particle 5, for example, may have a diameter of about 0.1 to 100 μm. The solder particle 5 may be plumbum, stannum, indium, bismuth, antimony, argentum or metal particle such as alloy of these. The flowable hardening resin 24 may flow and remove an oxide layer. Moreover, the flowable hardening resin 24 may include a hardening agent. The flowable hardening resin 24 may further include at least one of a reductant, a catalyst and a deforming agent. A second substrate 14 in which a second pad 15 is formed is disposed on the first substrate 1 on which the mixture 26 is doped.

Referring to FIG. 5B, the second substrate 14 is disposed to come in contact with the first terminal 50 and the upper surface of the pillar type bump 3, and the first substrate 1 is heated at a temperature higher than the melting point of the solder particle 5. Thus, the flowable hardening resin 24 removes an oxide layer that may be formed in the surface of the solder particle 5, and the solder particle 5 flows (or diffuses) to the both side surfaces of the first terminal 50 and the both side surfaces of the second pad 15 to be adhered, thereby forming a solder layer 10. The solder layer 10, therefore, may cover the first pad 2, the pillar type bump 3 and the both side surfaces of the second pad 15. The solder layer 10, accordingly, bonds the first terminal 50 and the second pad 15, increasing the bonding strength between the two substrates 1 and 14. The flowable hardening resin 24 reacts with a hardening agent included in it to be hardened through a heating process, being changed into a hardened underfill resin 25. A solder particle 5 that cannot form the solder layer 10 may be left inside the hardened underfill resin 25. However, since the left solder particle 5 is disposed inside the hardened underfill resin 25 having dielectric properties, limitations such as electrical short between the two substrates 1 and 14 are prevented.

According to another embodiment of the inventive concept, a flip chip bonding process and an underfill process are performed at the same time, and the bonding strength between the two substrates 1 and 14 is increased by the solder layer 10. The hardened underfill resin 25 further increases the bonding strength between the two substrates 1 and 14 and simultaneously protects a semiconductor package against an external environment. Although a process of fabricating the semiconductor package according to another embodiment of the inventive concept is similar to the process of embodiment 1, it does not all perform the processes of FIGS. 1A through 1F, thereby being simplified. Accordingly, the cost is saved and the process time is shortened.

Embodiment 6

Figure 6A:
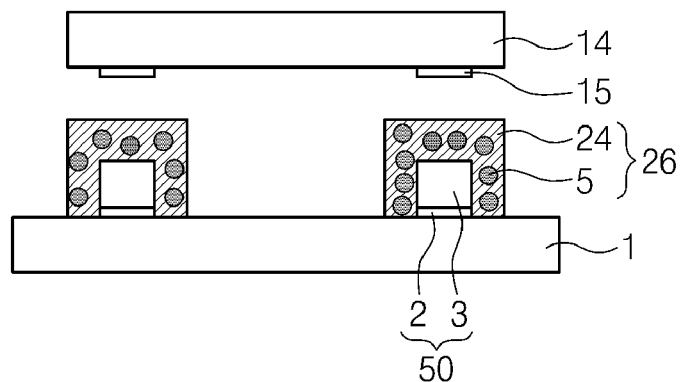
FIGS. 6A and 6B are cross-sectional views illustrating a process of fabricating a semiconductor package according to another embodiment of the inventive concept.
Figure 6B:
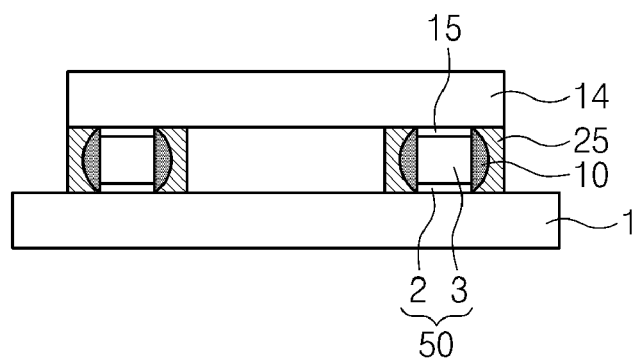

FIGS. 6A and 6B are cross-sectional views illustrating a process of fabricating a semiconductor package according to another embodiment of the inventive concept.

Referring to FIGS. 6A and 6B, in another embodiment of the inventive concept, the pitch between first terminals 50 is broader than the case of embodiment 5. In this way, when the pitch between the first terminals 50 is broad, a mixture 7 including a solder particle 5 and a flowable hardening resin 24 may be selectively doped on a desired position in a screen printer process, as illustrated in FIG. 6A. A second substrate 14 in which a second pad 15 is formed is disposed on the first substrate 1, and by applying heat and compression, a solder layer 10 covering the first terminal 50 and the both side walls of the second pad 15 is formed. As shown in FIG. 6B, since distance from the edge of a region (on which the mixture 26 is doped) to the surface of the first terminal 50 is shorter than the case of embodiment 5, the solder particle 5 may not almost be left inside the hardened underfill resin 25. In addition, detailed processes and process conditions may be the same as those of embodiment 5.

Embodiment 7

Figure 7A:
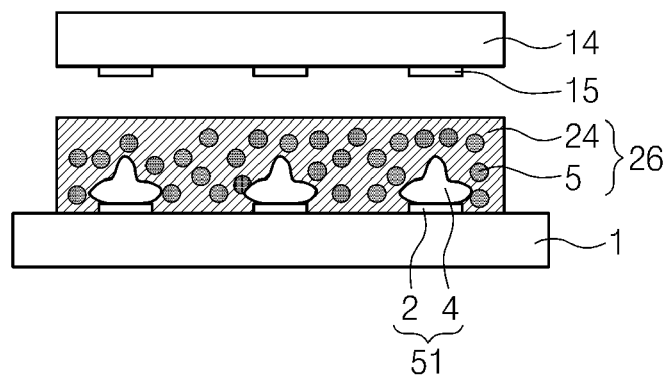
FIGS. 7A and 7B are cross-sectional views illustrating a process of fabricating a semiconductor package according to another embodiment of the inventive concept.
Figure 7B:
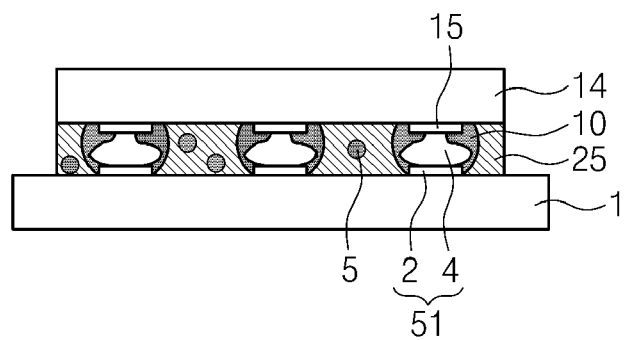

FIGS. 7A and 7B are cross-sectional views illustrating a process of fabricating a semiconductor package according to another embodiment of the inventive concept.

Referring to FIG. 7A, a first substrate 1 in which a first pad 2 is formed is prepared. A stud type bump 4 is formed on the first pad 2. For example, the stud type bump 4 may be formed of aurum, copper or an alloy of these. The first pad 2 and the stud type bump 4 may configure a first terminal 51. A mixture 26 including a solder particle 5 and a flowable hardening resin 24 is doped on the first substrate 1 in which the stud type bump 4 is formed. The mixture 26 covers the bent surface of the first terminal 51 and fills a space between the first terminal 51 and another first terminal 51 adjacent to it. In the mixture 26, the solder particle 5 and the flowable hardening resin 24 may be mixed at a volume rate of 1:9 to 5:5. The solder particle 5, for example, may have a diameter of about 0.1 to 100 μm. The solder particle 5 may be plumbum, stannum, indium, bismuth, antimony, argentum or metal particle such as alloy of these. The flowable hardening resin 24 may flow and remove an oxide layer. Moreover, the flowable hardening resin 24 may include a hardening agent. The flowable hardening resin 24 may further include at least one of a reductant, a catalyst and a deforming agent. A second substrate 14 in which a second pad 15 is formed is disposed on the first substrate 1 on which the mixture 26 is doped.

Referring to FIG. 7B, the second substrate 14 is disposed to come in contact with the first terminal 51 and the upper surface of the stud type bump 4, and the first substrate 1 is heated at a temperature higher than the melting point of the solder particle 5. Thus, the flowable hardening resin 24 removes an oxide layer that may be formed in the surface of the solder particle 5, and the solder particle 5 flows (or diffuses) to the bent surface of the first terminal 51 and the both side surfaces of the second pad 15 to be adhered, thereby forming a solder layer 10. The solder layer 10, therefore, may cover the first pad 2, the stud type bump 4 and the both side surfaces of the second pad 15. The solder layer 10, accordingly, bonds the first terminal 51 and the second pad 15, increasing the bonding strength between the two substrates 1 and 14. The flowable hardening resin 24 reacts with a hardening agent included in it to be hardened through a heating process, being changed into a hardened underfill resin 25. A solder particle 5 that cannot form the solder layer 10 may be left inside the hardened underfill resin 25. However, since the left solder particle 5 is disposed inside the hardened underfill resin 25 having dielectric properties, limitations such as electrical short between the two substrates 1 and 14 are prevented.

According to another embodiment of the inventive concept, a flip chip bonding process and an underfill process are performed at the same time, and the bonding strength between the two substrates 1 and 14 is increased by the solder layer 10. The hardened underfill resin 25 further increases the bonding strength between the two substrates 1 and 14 and simultaneously protects a semiconductor package against an external environment. Although a process of fabricating the semiconductor package according to another embodiment of the inventive concept is similar to the process of embodiment 3, it does not all perform the processes of FIGS. 3A through 3F, thereby being simplified. Accordingly, the cost is saved and the process time is shortened.

Embodiment 8

Figure 8A:
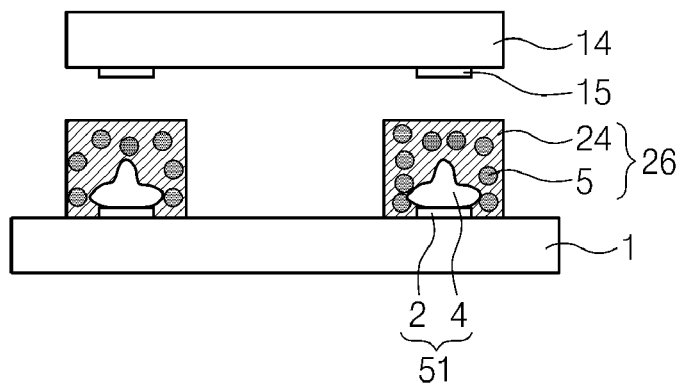
FIGS. 8A and 8B are cross-sectional views illustrating a process of fabricating a semiconductor package according to another embodiment of the inventive concept.
Figure 8B:
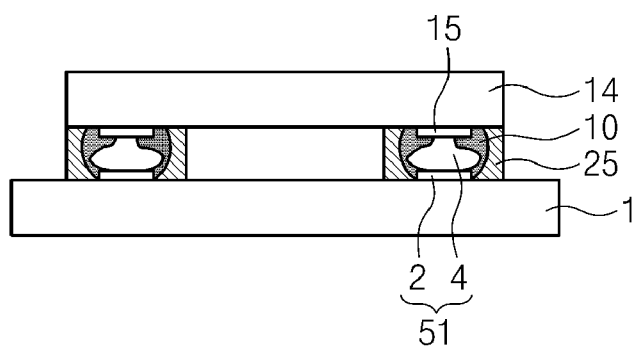

FIGS. 8A and 8B are cross-sectional views illustrating a process of fabricating a semiconductor package according to another embodiment of the inventive concept.

Referring to FIGS. 8A and 8B, in another embodiment of the inventive concept, the pitch between first terminals 51 is broader than the case of embodiment 7. In this way, when the pitch between the first terminals 51 is broad, a mixture 7 including a solder particle 5 and a flowable hardening resin 24 may be selectively doped on a desired position in a screen printer process, as illustrated in FIG. 8A. A second substrate 14 in which a second pad 15 is formed is disposed on the first substrate 1, and by applying heat and compression, a solder layer 10 covering the first terminal 51 and the both side walls of the second pad 15 is formed. As shown in FIG. 8B, since distance from the edge of a region (on which the mixture 26 is doped) to the surface of the first terminal 51 is shorter than the case of embodiment 7, the solder particle 5 may not almost be left inside the hardened underfill resin 25. In addition, detailed processes and process conditions may be the same as those of embodiment 7.

Embodiment 9

FIGS. 9A through 9D are cross-sectional views illustrating a process of fabricating a semiconductor package according to another embodiment of the inventive concept.

Figure 9A:
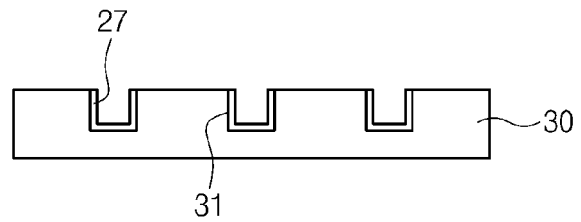
FIGS. 9A through 9D are cross-sectional views illustrating a process of fabricating a semiconductor package according to another embodiment of the inventive concept.

Referring to FIG. 9A, a via hole 31 is formed in a first substrate 30. Furthermore, a seed layer covering the side wall and bottom of the via hole 31 is formed. The seed layer 27 may be formed of titanium, nickel, platinum, aurum, copper or an alloy of these. The seed layer 27 may be formed in a Chemical Vapor Deposition (CVD) process or an Atomic Layer Deposition (ALD) process. Additionally, a planarization etching process may be further performed for forming the seed layer 27 covering the side wall and bottom of the via hole 31. The seed layer 27 may correspond to the first terminal of embodiment 1.

Figure 9B:
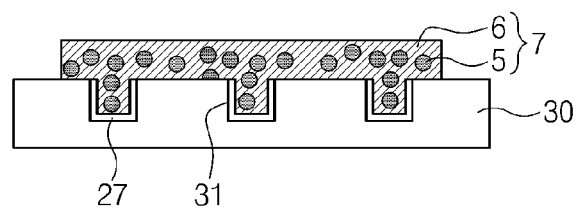

Referring to FIG. 9B, a mixture 7 including a solder particle 5 and a polymer resin 6 is doped on the first substrate 30 in which the seed layer 27 is formed. The mixture 7 is doped to fill the inside of the via hole 31. For this, vacuum may be given to the first substrate 30. The physical properties of the polymer resin 6 and the solder particle 5 may be the same as those of embodiment 1.

Figure 9C:
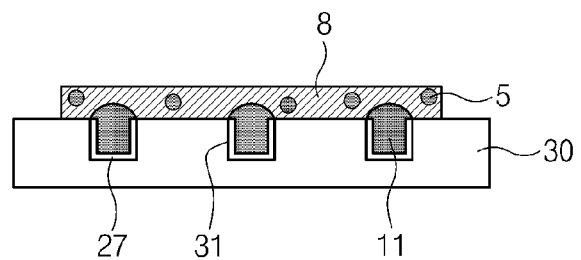

Referring to FIG. 9C, by heating the first substrate 30 at a temperature higher than the melting point of the solder particle 5, a solder via 11 covering the exposed surface of the seed layer 27 and filling the inside of the via hole 31 is formed. The solder via 11 is not formed inside a resin layer 8, and a left solder particle 5 may be included in the resin layer 8.

Figure 9D:
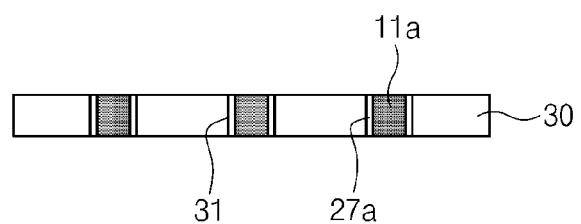
Figure 10A:
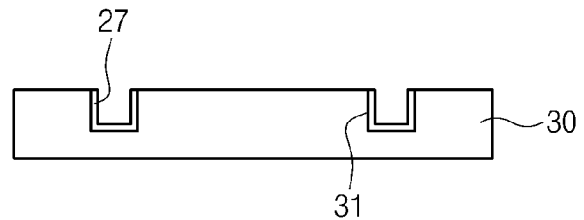
FIGS. 10A through 10D are cross-sectional views illustrating a process of fabricating a semiconductor package according to another embodiment of the inventive concept.
Figure 10B:
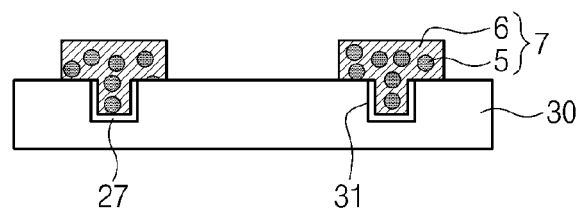
Figure 10C:
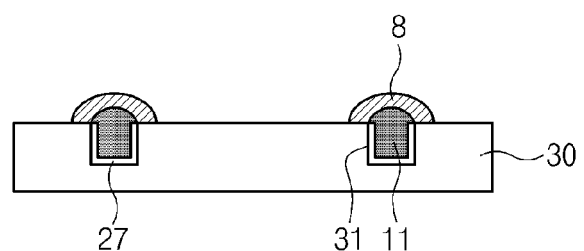
Figure 10D:
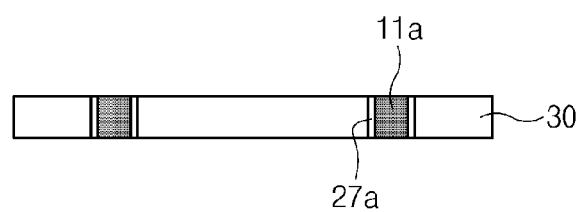

Referring to FIG. 9D, the resin layer is removed with a solvent agent. At this point, a solder particle 5 that is left inside the resin layer 8 may also be removed together. Furthermore, by performing a planarization removal process on the front surface and rear surface of the first substrate 30, a termination of the upper portion and lower portion of the first substrate 30 is removed, and a seed pattern 27a covering the inner side wall of the via hole 31 and a solder via plug 11a filling the via hole 31 are formed.

Subsequently, a rewiring electrically connected to the solder via plug 11a may be formed in the front surface and rear surface of the first substrate 30 including the solder via plug 11a. The first substrate 30 may be used as a mounting substrate such as a printed circuit board or a ceramic substrate on which a semiconductor chip is mounted. Alternatively, the first substrate 30 may be a semiconductor chip including a through via such as a through silicon via.

Embodiment 10

FIGS. 10A through 10D are cross-sectional views illustrating a process of fabricating a semiconductor package according to another embodiment of the inventive concept.

Referring to FIGS. 10A through 10D, in another embodiment of the inventive concept, the pitch between via holes 31 formed on a first substrate 30 is broader than the case of embodiment 9. In this case, a mixture 7 including a solder particle 5 and a polymer resin 6 may be doped in a screen printer process. At this point, like embodiment 9, vacuum may be given to the first substrate 30 in order for the mixture 7 to fill the via hole 31. In addition, the order and condition of a process may be the same as those of embodiment 9.

The method for fabricating semiconductor package according to an embodiment of the inventive concept dopes a mixture including the polymer material and the solder particle on the substrate in which the terminal is formed and applies heat, and thus the solder particle flows (or diffuses) toward the terminal in the heated polymer resin to adhere to the exposed surface of the terminal, i.e., the side surface and upper surface of the terminal, thereby forming the solder layer. The solder layer improves the adhesive strength between the terminal of the semiconductor chip and the terminal of the substrate in the subsequent flip chip bonding process.

In the method for fabricating semiconductor package according to an embodiment of the inventive concept, moreover, the pad of the substrate may protrude from the substrate, and may be configured with the pad and the bump disposed on it. The pitch between the semiconductor chip and the substrate can be constantly maintained by the terminal that is configured with the pad and the bump. Compared with a case in which the terminal includes only the pad without including the bump and there is the solder layer covering the surface of the terminal, in an embodiment of the inventive concept where the terminal includes both the pad and the bump, the risk of electrical short (which is caused by the contact of two adjacent solder layers) is removed because the bump serves as the support bar between the semiconductor chip and the substrate. Accordingly, the method for fabricating semiconductor package can be easily applied to the multiplying of pin and the narrowing of pitch.

In the semiconductor package according to another embodiment of the inventive concept, bonding strength can increase by the solder layer covering the surfaces of the pads that are disposed between the two substrates or between the semiconductor chip and the mounting substrate.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method for fabricating a semiconductor package, comprising:
    forming a first terminal on a first substrate;
    mixing a polymer resin and solder particles at a volume rate of 1:9 to 5:5 to provide a mixture;
    covering at least one of an upper surface and a side surface of the first terminal with the mixture; and
    heating the first substrate at a temperature higher than a melting point of the solder particles of the mixture to form a solder layer that covers said at least one of an upper surface and a side surface of the first terminal.

2. The method of claim 1, wherein the first substrate has an upper surface, and wherein the first terminal protrudes upward from the upper surface of the first substrate and comprises a metal pad and a metal bump which is disposed on the metal pad.

3. The method of claim 2, wherein the metal bump is a pillar type bump or a stud type bump.

4. The method of claim 1, further comprising forming a hole in the first substrate before forming the first terminal,
    wherein the hole is defined to have an inner side wall and a bottom, and
    wherein the first terminal is formed to cover the inner side wall and the bottom of the hole, and the solder layer fills the hole.

5. The method of claim 4, wherein the first substrate has a front surface and a rear surface, and wherein the method further comprises planarizing the front surface and the rear surface of the first substrate.

6. The method of claim 1, wherein a space is defined between the first terminal and another first terminal positioned adjacent to said first terminal, and wherein the covering at least one of an upper surface and a side surface of the first terminal with the mixture includes extending the mixture to cover the space defined between the first terminal and another first terminal.

7. The method of claim 1, further comprising removing the polymer resin to expose the solder layer, after forming the solder layer.

8. The method of claim 7, further comprising:
    providing a flowable hardening resin covering a side surface of the exposed solder layer;
    disposing a second substrate, in which a second terminal is formed, on the first substrate to come in contact with the second terminal and the solder layer;
    heating the first substrate at a temperature higher than a melting point of the solder layer to couple the first and second terminals through the solder layer; and
    hardening the flowable hardening resin.

9. The method of claim 1, further comprising disposing a second substrate, in which a second terminal is formed, on the first substrate before heating the first substrate to position the second terminal adjacent to the first terminal.

10. The method of claim 9, wherein the mixture further comprises a hardening agent, and wherein the polymer resin is hardened with the hardening agent during the heating the first substrate.

11. The method of claim 8, wherein the second substrate comprises a semiconductor chip.

12. The method of claim 1, wherein the solder particle has a diameter ranging from about 0.1 to about 100 μm.

13. The method of claim 1, wherein the solder particle has a diameter ranging from about 0.1 to about 70 μm.

14. A method for fabricating a semiconductor package, comprising:
    forming a first terminal at a first substrate;
    mixing a polymer resin and solder particles to provide a mixture;
    covering at least one of an upper surface and side surfaces of the first terminal with the mixture; and
    heating the first substrate at a temperature higher than a melting point of the solder particles of the mixture to form a solder layer that covers the at least one of an upper surface and side surfaces of the first terminal,
    wherein the solder particles each have a diameter ranging from about 0.1 to about 100 μm.

* * * * *